(12) United States Patent
Kato

(10) Patent No.: US 7,518,438 B2
(45) Date of Patent: Apr. 14, 2009

(54) FM DETECTOR CIRCUIT WITH UNBALANCED/BALANCED CONVERSION

(75) Inventor: Akira Kato, Takatsuki (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 92 days.

(21) Appl. No.: 11/616,908

(22) Filed: Dec. 28, 2006

(65) Prior Publication Data

US 2007/0109041 A1    May 17, 2007

Related U.S. Application Data

(63) Continuation of application No. PCT/JP2005/012307, filed on Jul. 4, 2005.

(30) Foreign Application Priority Data

Aug. 20, 2004   (JP)   .............................. 2004-240379

(51) Int. Cl.
*H04L 27/14* (2006.01)
(52) U.S. Cl. ........................................ 329/315; 329/328
(58) Field of Classification Search ................. 329/328, 329/315, 334, 344
See application file for complete search history.

(56) References Cited

U.S. PATENT DOCUMENTS 2,878,384 A * 3/1959 Holmes ....................... 329/332
3,155,913 A * 11/1964 Prenosil et al. ............. 329/328
3,160,822 A * 12/1964 Dix ............................. 329/320
3,170,121 A * 2/1965 Ho et al. ..................... 329/328
3,573,643 A * 4/1971 Livenick ..................... 329/328
3,772,605 A * 11/1973 Otajima et al. ............. 329/328
3,934,207 A * 1/1976 Fischman et al. .......... 329/328
3,936,764 A * 2/1976 Fischman et al. .......... 329/328
5,070,305 A * 12/1991 Confalonieri et al. ........ 330/69

FOREIGN PATENT DOCUMENTS

| JP | 56-014705 A | 2/1981 |
| JP | 61-228708 A | 10/1986 |
| JP | 61-285813 A | 12/1986 |
| JP | 03-085947 A | 4/1991 |
| JP | 11-195928 A | 7/1999 |

OTHER PUBLICATIONS

Official communication for PCT Application No. PCT/JP2005/012307 mailed on Oct. 11, 2005.

* cited by examiner

*Primary Examiner*—Joseph Chang
(74) *Attorney, Agent, or Firm*—Keating & Bennett, LLP

(57) ABSTRACT

An FM detector circuit includes an unbalanced/balanced conversion circuit, a signal synthesis circuit, a parallel circuit including a first diode connected between a first balanced output terminal of the unbalanced/balanced conversion circuit and one signal input terminal of the signal synthesis circuit and a resonator, a parallel circuit including a second diode connected between a second balanced output terminal of the unbalanced/balanced conversion circuit and the other signal input terminal of the signal synthesis circuit and a capacitor element, and a low-pass filter connected to an output terminal of the signal synthesis circuit.

9 Claims, 2 Drawing Sheets

FM DETECTOR CIRCUIT WITH UNBALANCED/BALANCED CONVERSION

BACKGROUND OF THE INVENTION

1. Field of the Invention

The present invention relates to an FM detector circuit.

2. Description of the Related Art

Examples of an FM detector circuit include a circuit using a Foster-Seeley method, a circuit using a ratio method, a circuit using a PLL method, a circuit using a slope detection method, and a circuit using a discriminator detection method. Japanese Unexamined Patent Application Publication No. 11-195928 (Patent Document 1) discloses an FM detector circuit using a slope detection method. According to Patent Document 1, by using impedance in a resonator, which is changed at a resonant frequency and in the vicinity thereof, frequency modulation (FM component)—amplitude modulation (AM component) conversion of a signal is performed, and furthermore, envelope detection is performed using a diode, whereby FM detection is achieved.

Japanese Unexamined Patent Application Publication No. 56-14705 (Patent Document 2) discloses an FM detector circuit using a discriminator detection method. The circuit uses impedance, which is changed at a resonant frequency and in the vicinity thereof, in a piezoelectric resonator so that amplitude modulation of an output signal is rectified by two diodes for AM detection.

For example, for a remote keyless entry receiver, an FSK signal must be demodulated. Normally, an RF signal is heterodyned into an IF signal (a superheterodyne method), and then, the IF signal is detected. However, a superheterodyne method requires a number of components such as a local oscillator, a mixer and other suitable components. To address this problem, a direct detection method in which an RF signal is directly detected without frequency conversion may be used. However, there is a high possibility that an amplifier circuit causes oscillation when an RF signal is greatly amplified for detection. In this case, an amplification factor should be suppressed. Therefore, it is desirable that a low-level RF signal is detected before being amplified.

However, the FM detector circuits according to Patent Document 1 and Patent Document 2 have problems in that since the FM detector circuits have low detection sensitivity, a detection output is low when an RF signal is at a low level.

SUMMARY OF THE INVENTION

To overcome the problems described above, preferred embodiments of the present invention provide an FM detector circuit having high detection sensitivity.

An FM detector circuit according to preferred embodiments of the present invention includes an unbalanced/balanced conversion circuit, a first diode having one end connected to a first balanced output terminal of the unbalanced/balanced conversion circuit, a second diode having one end connected to a second balanced output terminal of the unbalanced/balanced conversion circuit, a resonator connected to the first diode in parallel, a capacitor element connected to the second diode in parallel, a signal synthesis circuit having two input terminals to which the other end of the first diode and the other end of the second diode are connected, and a low-pass filter connected to an output terminal of the signal synthesis circuit.

In the FM detector circuit according to preferred embodiments of the present invention, a resonant frequency of the resonator may be displaced from a center frequency of an FM signal input to the FM detector circuit by at least a frequency deviation of the FM signal.

The FM detector circuit according to preferred embodiments of the present invention performs FM detection with a very simple circuit.

Other features, elements, steps, characteristics and advantages of the present invention will become more apparent from the following detailed description of preferred embodiments of the present invention with reference to the attached drawings.

DETAILED DESCRIPTION OF PREFERRED EMBODIMENTS

First Preferred Embodiment

Figure 1:
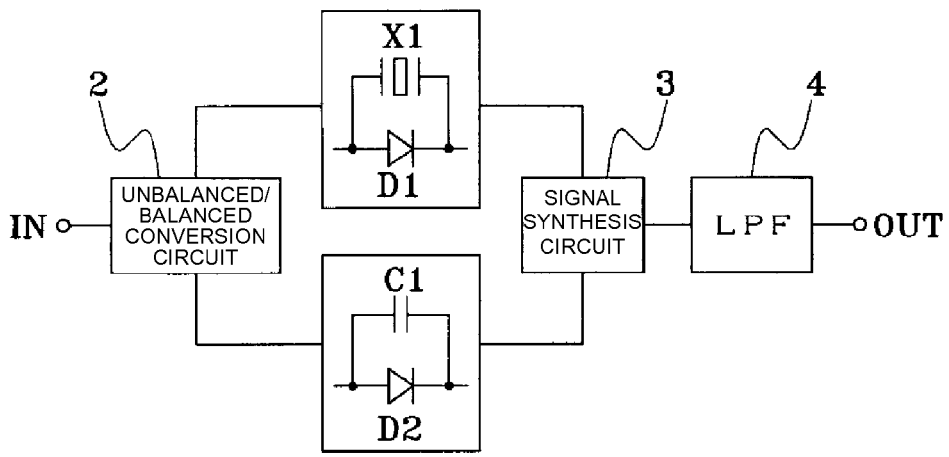
FIG. 1 is a block diagram of an FM detector circuit according to preferred embodiments of the present invention.

FIG. 1 shows a block diagram of an FM detector circuit according to a preferred embodiment of the present invention. In FIG. 1, an FM detector circuit 1 preferably includes an input terminal IN, an unbalanced/balanced conversion circuit 2, a diode D1 as a first diode, a diode D2 as a second diode, a resonator X1, a capacitor C1 defining a capacitor element, a signal synthesis circuit 3, a low-pass filter 4, and an output terminal OUT.

The input terminal IN is connected to an unbalanced terminal of the unbalanced/balanced conversion circuit 2. A first balanced output terminal of the unbalanced/balanced conversion circuit 2 is connected to one input terminal of the signal synthesis circuit 3 through a parallel circuit including the diode D1 and the resonator X1. A second balanced output terminal of the unbalanced/balanced conversion circuit 2 is connected to the other input terminal of the signal synthesis circuit 3 through a parallel circuit including the diode D2 and the capacitor C1. A signal output from the signal synthesis circuit 3 is supplied to the output terminal OUT through the low-pass filter 4.

The resonator X1 is configured as an equivalent circuit such that a small-resistance component, an inductance component, and a first capacitance component are connected in series, and further, a separate second capacitance component is connected in parallel to the components connected in series. Examples of the resonator X1 include a surface acoustic wave resonator (SAWR) and a crystal oscillator. A capacitance that is substantially the same as that of the second capacitance component, which is the capacitance between the two terminals of the resonator X1, is selected for the capacitor C1.

The diode D1 and the diode D2 preferably have the same characteristics. Each of the diodes D1 and D2 has a predetermined forward current. A current value for each of the diodes D1 and D2 is set so that a conducting resistance of each of the diodes is comparatively closer to an absolute value of an impedance in the vicinity of a signal frequency of the capacitor C1.

A resonant frequency (a series resonant frequency based on the inductance component and the first capacitance component connected to each other in series) of the resonator X1 is displaced from a center frequency of an input FM signal so as to slightly exceed a maximum frequency deviation of the input FM signal from the center frequency. In this preferred embodiment, the resonant frequency of the resonator X1 is preferably set higher than the center frequency of the FM signal. However, the center frequency of the FM signal may be set higher than the resonant frequency of the resonator X1. In this case, the polarity of an output signal reversed.

The operation of the circuit will now be described.

In the parallel circuit including the diode D1 and the resonator X1, a signal is input, for example, to an anode of the diode D1 and output from a cathode of the diode D1. Similarly, in the parallel circuit including the diode D2 and the capacitor C1, a signal is input, for example, to an anode of the diode D2 and output from a cathode of the diode D2. As long as the diodes D1 and D2 have forward currents flowing therethrough, a signal can be input to one of the anode and the cathode and output from the other side.

It is assumed that an input FM signal has a low frequency and the frequency is sufficiently lower than the resonant frequency of the resonator X1. In this case, the resonator X1 merely functions as a capacitor element, and a capacitance of the resonator X1 is substantially the same as the capacitance of the capacitor C1. Therefore, the parallel circuit including the diode D1 and the resonator X1 has substantially the same characteristics as the parallel circuit including the second diode D2 and the capacitor C1. Signals output from the unbalanced/balanced conversion circuit 2 are input to the corresponding parallel circuits. The signals have the same amplitude as each other but have opposite phases (shifted by 180 degrees with respect to each other). Since the two parallel circuits has the same characteristics, signals output from the two parallel circuits have the same amplitude as each other but have opposite phases. Accordingly, when the two obtained signals are input to the signal synthesis circuit 3, the signals cancel each other out, resulting in no output.

Next, it is assumed that an input FM signal has a high frequency and the frequency is slightly lower than the resonant frequency of the resonator X1. In this case, since the signal having the frequency slightly lower than the resonant frequency of the resonator X1 passes through the resonator X1, an impedance of the resonator X1 to the signal is significantly low. On the other hand, an impedance of the capacitor C1 is stable unless the frequency of the signal is greatly changed. That is, the impedance of the capacitor C1 is substantially stable under a frequency change corresponding to a frequency deviation of the FM signal. Therefore, the signal which passes through the parallel circuit including the diode D1 and the resonator X1 is greater than a signal which passes through the parallel circuit including the diode D2 and the capacitor C1. Since phase changes of the signals are negligible, the two signals which have passed through the corresponding parallel circuits include alternating current components having opposite phases and having amplitudes considerably different from each other. When the two signals are input to the signal synthesis circuit 3, since the amplitudes of the signals are different from each other, the two signals do not cancel each other out and a signal having an amplitude equal to a difference in amplitude between the two signals is output. Since the two signals that have passed through the two parallel circuits have direct current components, negative voltage swing caused by superposed alternating current components does not occur. Therefore, when the signal is smoothed using the low-pass filter 4, a signal having a certain amplitude is obtained.

It is assumed that an input FM signal has a frequency which is an intermediate frequency between the frequencies of the above two signals. In this case, since a signal that has passed through and been output from the resonator X1 has an amplitude which is an intermediate amplitude between the amplitudes of the two signals, a signal having an amplitude, which is an intermediate amplitude between the amplitudes of the two signals, is obviously output through the output terminal OUT. This illustrates that the difference in frequency between the input signals is reflected by the difference in amplitude between the output signals. That is, an F-V conversion function is achieved and FM detection is achieved.

A frequency characteristic of the impedance of the resonator X1 depends on a Q factor of the resonator. That is, if a Q factor of a resonator is large, a gradient of an impedance with respect to a frequency is large. Accordingly, even if a deviation (a frequency deviation) of an input FM signal is small, a large detection output is obtained.

As described above, the FM detector circuit according to this preferred embodiment of the present invention performs FM detection with a very simple circuit.

Second Preferred Embodiment

Figure 2:
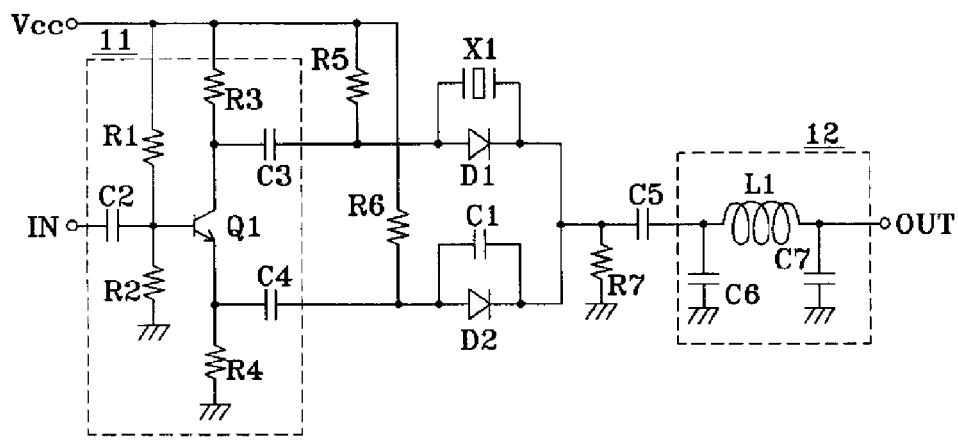
FIG. 2 is a circuit diagram of the FM detector circuit according to a preferred embodiment of the present invention.

FIG. 2 is a circuit diagram of an FM detector circuit according to another preferred embodiment of the present invention which embodies a configuration of the above preferred embodiment. In FIG. 2, reference numerals that are the same as those in FIG. 1 are used for parts having the same functions as those shown in FIG. 1, and a description thereof is omitted.

An FM detector circuit 10 shown in FIG. 2 includes an unbalanced/balanced conversion circuit 11 including a transistor Q1. In the unbalanced/balanced conversion circuit 11, a base of the transistor Q1 is connected to an input terminal IN through a capacitor C2, connected to a power supply terminal Vcc through a resistor R1, and also connected to ground through a resistor R2. The resistors R1 and R2 define a condition of a base bias of the transistor Q1. A collector of the transistor Q1 is connected to the power supply terminal Vcc through a resistor R3 and an emitter is connected to the ground through a resistor R4. The collector and the emitter of the transistor Q1 are connected to one end of a capacitor C3 and one end of a capacitor C4, respectively. In the unbalanced/balanced conversion circuit 11 configured as described above, a signal having the same phase as a signal supplied to the base of the transistor Q1 is output through the emitter and the capacitor C4, and a signal having a phase opposite that of the signal output to the emitter is output through the collector and the capacitor C3. An unbalanced/balanced conversion circuit having such a configuration is well known and is disclosed, for example, in Japanese Unexamined Patent Application Publication No. 61-285813.

The other end of the coupling capacitor C3 is connected to an anode of a diode D1 as a first diode, and similarly, the other end of the coupling capacitor C4 is connected to an anode of a diode D2 as a second diode. A cathode of the diode D1 and a cathode of the diode D2 are connected to each other, and further connected to one end of a coupling capacitor C5. The anode of the diode D1 is connected to the power supply terminal Vcc through a resistor R5 and the anode of the diode D2 is connected to the power supply terminal Vcc through a resistor R6. A connection point of the cathode of the diode D1 and the cathode of the diode D2 is connected to the ground through a resistor R7. The resistors R5, R6 and R7 define forward currents to be supplied to the diodes D1 and D2. The connection point of the cathode of the diode D1 and the cathode of the diode D2 substantially functions as a signal synthesis circuit.

The other end of the coupling capacitor C5 is connected to an output terminal OUT through an inductance element L1. One end and the other end of the inductance element L1 are connected to the ground through capacitors C6 and C7, respectively. The inductance element L1 and the capacitors C6 and C7 define a low-pass filter circuit 12.

The FM detector circuit 10 is substantially the same as the FM detector circuit 1, except for the configurations of the unbalanced/balanced conversion circuit and the low-pass filter, and a configuration of the circuit for supplying bias currents to the diodes D1 and D2. Accordingly, the FM detector circuit 10 also achieves an FM detection function.

Figure 3:
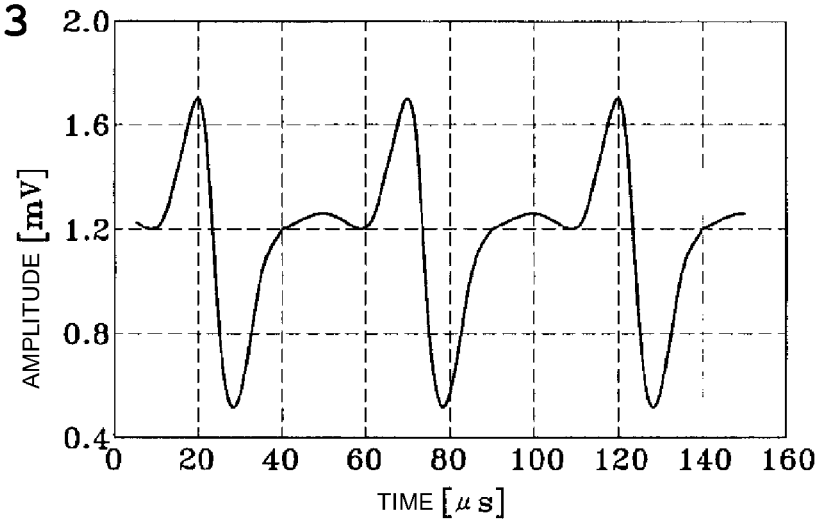
FIG. 3 is a waveform diagram showing a waveform of a detection output signal from the FM detector circuit illustrated in FIG. 2 obtained by a simulation.

FIG. 3 shows a result of a simulation of an operation of the FM detector circuit 10. FIG. 3 shows a waveform of a signal output from the FM detector circuit 10. It is assumed that, as an input signal, a carrier signal of approximately 9.95 MHz is modulated by a modulation signal of approximately 20 kHz using a modulation index of 2 to have an amplitude of approximately ±10 mV and a deviation of approximately 40 kHz. A resonator connected to the first diode in parallel is configured such that a resistor of approximately 10 Ω, a capacitor of approximately 0.13263 pF, and an inductance element of approximately 1.90986 mH connected in series are connected to a capacitor of approximately 2 pF in parallel to obtain a series resonator frequency of approximately 10 MHz, for example. As a capacitor element connected to the second diode in parallel, a capacitor of approximately 2 pF, which has a capacitance substantially the same as a parallel capacitance of the resonator, is preferably used, for example.

As shown in FIG. 3, a repetitive waveform of approximately 20 kHz is obtained and FM detection is achieved. When compared to a result of a similar simulation performed for a circuit disclosed in Patent Document 2, a sensitivity several times larger is obtained.

The waveform includes large distortions and the linearity thereof is not sufficiently. However, if an FM signal is an FSK signal modulated by a binary digital signal, the FM signal is sufficiently recognized after being amplified and being supplied to a comparator in which an appropriate threshold value is set. It is believed that the distortions, which are present in transitions of a detection signal from the minimum value to the maximum value, derive from nonlinearity caused by phase inversion in the unbalanced/balanced conversion circuit.

In the FM detector circuit 10, a high frequency signal is input from the anodes of the diodes D1 and D2. However, a circuit configured such that directions of the diodes D1 and D2 are reversed and each of the diodes D1 and D2 has a forward current achieves a similar operation effect. Alternatively, a circuit configured such that a high frequency signal is input to one of the diodes D1 and D2 from an anode thereof and a high frequency signal is input to the other diode from a cathode thereof achieves a similar operation effect.

Third Preferred Embodiment

Figure 4:
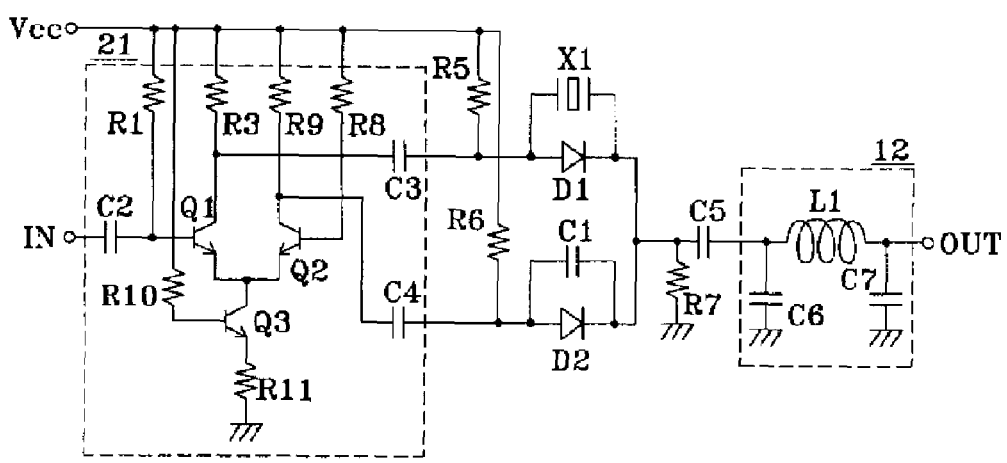
FIG. 4 is a circuit diagram illustrating an FM detector circuit according to another preferred embodiment of the present invention.

FIG. 4 shows a circuit diagram of another preferred embodiment of an FM detector circuit according to the present invention. An FM detector circuit 20 shown in FIG. 4 is substantially the same as the FM detector circuit 10 shown in FIG. 2, except that a configuration of a unbalanced/balanced conversion circuit 21 is different from that of the unbalanced/balanced conversion circuit 11. The same reference numerals are used for parts having the same functions as those shown in FIG. 2 and a description thereof is omitted.

In the unbalanced/balanced conversion circuit 21, a base of a transistor Q1 is connected to a power supply terminal Vcc through a resistor R1 and a collector of the transistor Q1 is connected to the power supply terminal Vcc through a resistor R3. A base of a transistor Q2 is connected to the power supply terminal Vcc through a resistor R8 and a collector of the transistor Q2 is connected to the power supply terminal Vcc through a resistor R9. Emitters of the transistors Q1 and Q2 are connected to each other, and are further connected to a collector of a transistor Q3. A base of the transistor Q3 is connected to the power supply terminal Vcc through a resistor R10 and an emitter of the transistor Q3 is connected to ground through a resistor R11. The base of the transistor Q1 is connected to an input terminal IN through a coupling capacitor C2, and the collector of the transistor Q1 and the collector of the transistor Q2 are connected to one end of a coupling capacitor C3 and one end of a coupling capacitor C4, respectively.

In the circuit configured as described above, since the transistor Q3 functions as a constant current circuit, the circuit defined by the transistors Q1, Q2, and Q3 functions as a differential amplifier circuit in which the base of the transistor Q1 functions as a signal input terminal and the collectors of the transistors Q1 and Q2 function as signal output terminals. The two output signals have opposite phases. Accordingly, the circuit functions as an unbalanced/balanced conversion circuit in which the base of the transistor Q1 functions as an unbalanced signal input terminal and the collectors of the transistors Q1 and Q2 function as balanced signal output terminals.

The FM detector circuit 20 is different from the FM detector circuit 10 only in the configuration of the unbalanced/balanced conversion circuit 21 when compared to that of the unbalanced/balanced conversion circuit 11 included in the FM detector circuit 10. A processing circuit which is used after a signal is converted into a balanced signal is the same as that in the FM detector circuit 10. Accordingly, the FM detector circuit 20 functions similarly to that in the FM detector circuit 10.

Figure 5:
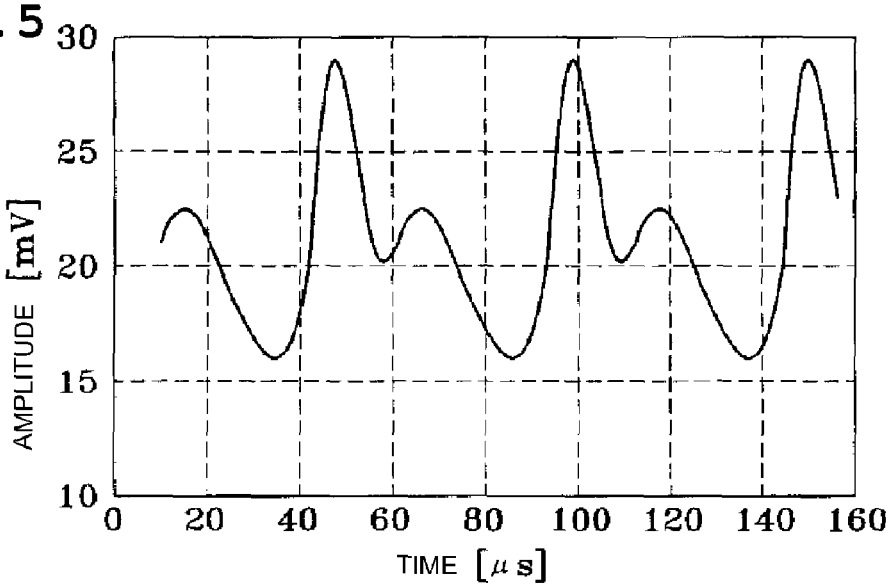
FIG. 5 is a waveform diagram showing a waveform of a detection output signal from the FM detector circuit illustrated in FIG. 4 obtained by a simulation.

FIG. 5 shows a result of a simulation of an operation of the FM detector circuit 20. FIG. 5 shows a waveform of a signal output from the FM detector circuit 20. Preconditions are set to be similar to those for the simulation of the operation of the FM detector circuit 10 shown in FIG. 3.

As shown in FIG. 5, a repetitive waveform of approximately 20 kHz is obtained and FM detection is achieved. When compared with a result of a similar simulation performed for the FM detector circuit 10 shown in the second preferred embodiment, an output level approximately ten times larger is obtained.

The waveform includes large distortions and the linearity thereof is not sufficient. However, if an FM signal is an FSK signal modulated by a binary digital signal, the FM signal can be sufficiently recognized after being amplified and being supplied to a comparator in which an appropriate threshold value is set. It is believed that the distortions, which are present in transitions of a detection signal from the maximum value to the minimum value, derive from nonlinearity caused by phase inversion in the unbalanced/balanced conversion circuit.

Fourth Preferred Embodiment

Figure 6:
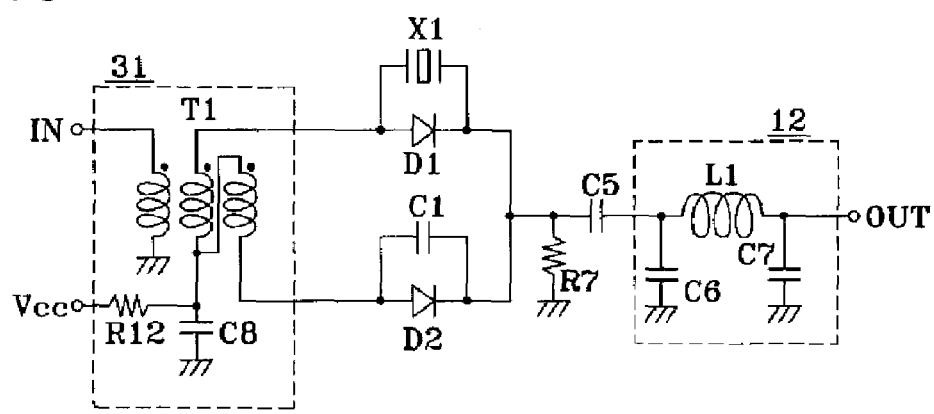
FIG. 6 is a circuit diagram illustrating an FM detector circuit according to still another preferred embodiment of the present invention.

FIG. 6 is a circuit diagram illustrating an FM detector circuit according to still another preferred embodiment of the present invention. An FM detector circuit 30 shown in FIG. 6 is substantially the same as the FM detector circuit 10 shown in FIG. 2, except that an unbalanced/balanced conversion circuit 31 is different from the unbalanced/balanced conversion circuit 11, and accordingly, an arrangement of resistors for supplying direct currents to the diodes D1 and D2 is changed. The same reference numerals are used for parts having the same functions as those shown in FIG. 2 and description thereof is omitted.

The unbalanced/balanced conversion circuit 31 includes a wire-wound balun transformer T1. In the balun transformer T1, a first wire, a second wire, and a third wire are wound around a single core. A first end of the first wire is directly connected to an input terminal IN and a second end of the first wire is connected to ground. A first end of the second wire is directly connected to an anode of the diode D1 and a second end of the second wire is connected to ground through a capacitor C8, which has a small impedance, to be grounded in terms of high frequency in a signal frequency. A first end of the third wire is connected to the second end of the second wire and a second end of the third wire is directly connected to an anode of the diode D2. A connection point of the second end of the second wire and the first end of the third wire is connected to a power supply terminal Vcc through a resistor R12. Since the resistor R12 is used for supplying forward bias currents to the diodes D1 and D2, the resistors R5 and R6 included in the FM detector circuit 10 are eliminated. Furthermore, since bias currents for the diodes D1 and D2 are supplied through the balun transformer T1, the coupling capacitors C3 and C4 for cutting DC are also eliminated. Moreover, the coupling capacitor C2 arranged between the input terminal IN and the unbalanced/balanced conversion circuit is eliminated. As is known, the balun transformer T1 functions as an unbalanced/balanced converter. Accordingly, the unbalanced/balanced conversion circuit 31 achieves the function of a unbalanced/balanced converter.

The FM detector circuit 30 configured as described above is substantially the same as the FM detector circuit 1 but differs in the configuration of the unbalanced/balanced conversion circuit. Accordingly, the FM detector circuit 30 also achieves an FM detection function.

Since the FM detector circuit 30 uses the balun transformer T1 in the unbalanced/balanced conversion circuit 31, bias currents can be supplied to the diodes through the balun transformer T1. Consequently, the number of resistors used for supplying bias currents and capacitors for cutting DC are reduced and a compact FM detector circuit is obtained.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. An FM detector circuit, comprising:
an unbalanced/balanced conversion circuit;
a first diode having one end connected to a first balanced output terminal of the unbalanced/balanced conversion circuit;
a second diode having one end connected to a second balanced output terminal of the unbalanced/balanced conversion circuit;
a resonator connected in parallel to the first diode;
a capacitor element connected in parallel to the second diode;
a signal synthesis circuit having two input terminals to which the other end of the first diode and the other end of the second diode are connected, respectively; and
a low-pass filter connected to an output terminal of the signal synthesis circuit; wherein
one end of the resonator is connected to an anode terminal of the first diode and another end of the resonator is connected to a cathode terminal of the first diode; and
one end of the capacitor is connected to an anode terminal of the second diode and another end of the capacitor is connected to a cathode terminal of the second diode.

2. The FM detector circuit according to claim 1, wherein a resonant frequency of the resonator is displaced from a center frequency of an FM signal input to the FM detector circuit by at least a frequency deviation of the FM signal.

3. The FM detector circuit according to claim 1, wherein the resonator includes one of a surface acoustic wave resonator and a crystal oscillator.

4. The FM detector circuit according to claim 1, wherein the first and second diodes have the same characteristics.

5. The FM detector circuit according to claim 1, wherein the unbalanced/balanced conversion circuit includes transistor.

6. The FM detector circuit according to claim 5, wherein the unbalanced/balanced conversion circuit further includes an input terminal, a capacitor, a power supply terminal, and first, second, third, and fourth resistors, a base of the transistor is connected to the input terminal through the capacitor, connected to the power supply terminal through the first resistor, and connected to ground through the second resistor, a collector of the transistor is connected to the power supply terminal through the third resistor, and an emitter of the transistor is connected to ground through the fourth resistor.

7. The FM detector circuit according to claim 1, wherein the unbalanced/balanced conversion circuit includes a plurality of transistors which define a differential amplifier.

8. The FM detector circuit according to claim 7, wherein the plurality of transistors includes first, second, and third transistors, the first and second transistors define the differential amplifier, and the third transistor defines a constant current circuit.

9. The FM detector circuit according to claim 1, wherein the unbalanced/balanced conversion circuit includes a wire-wound balun transformer including first, second, and third wires would around a single core.

* * * * *